US010915031B1

(12) United States Patent
Melvin, III

(10) Patent No.: US 10,915,031 B1
(45) Date of Patent: Feb. 9, 2021

(54) OPTICAL SOURCE COMPENSATION

(71) Applicant: Synopsys, Inc., Mountain View, CA (US)

(72) Inventor: Lawrence S. Melvin, III, Hillsboro, OR (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 15/891,249

(22) Filed: Feb. 7, 2018

Related U.S. Application Data

(60) Provisional application No. 62/456,058, filed on Feb. 7, 2017, provisional application No. 62/459,782, filed on Feb. 16, 2017.

(51) Int. Cl.
   *G06F 30/30*    (2020.01)
   *G03F 7/20*     (2006.01)

(52) U.S. Cl.
   CPC .......... *G03F 7/70441* (2013.01); *G06F 30/30* (2020.01)

(58) Field of Classification Search
   CPC ........ G03F 7/705; G03F 7/70125; G03F 1/36; G03F 7/70441; G03F 7/70433; G03F 7/70283; G03F 1/44; G03F 7/70641; G03F 1/50; G03F 7/70191; G03F 7/70291; G03F 1/42; G03F 7/0002; G03F 7/70041; G03F 7/70575; G03F 7/70308; G03F 7/70608; G03F 7/7055; G03F 7/70616; G03F 7/70633; G03F 7/70558; G06F 2217/12; G06F 17/5081; G06F 17/50; G06F 17/5009; G06F 17/5068; G06F 17/5036; G06F 2217/06; G06F 2217/08; G06F 2217/10; G06F 17/5045; G06F 17/10; G06F 19/00; G06F 2217/14; G06F 2119/18; G06F 30/367; G06F 30/398; G06F 30/20; G06F 30/30; G06F 30/392; H01J 2237/0245; G06T 2207/30148; G01N 2021/95676
   USPC ..................................................... 716/50–56
   See application file for complete search history.

(56) References Cited

U.S. PATENT DOCUMENTS

| 2005/0097500 | A1* | 5/2005 | Ye .......................... G03F 7/705 716/52 |
| 2006/0068334 | A1* | 3/2006 | Sandstrom .......... G03F 7/70283 430/322 |
| 2006/0236271 | A1* | 10/2006 | Zach ........................ G03F 1/36 716/30 |

(Continued)

*Primary Examiner* — Binh C Tat
(74) *Attorney, Agent, or Firm* — Alston & Bird LLP

(57) ABSTRACT

A method of compensating for degradation of an optical source includes in part, generating a first model of the optical source at a first point in time, generating a second model of the optical source at a second point in time occurring after the first point in time, determining the difference between the first and second models, and varying a dose of the optical source if the determined difference is greater than a first threshold value. The compensation method optionally includes, in part, varying a focus distance of the optical source if the determined difference is greater than the first threshold value. The generation of the first model optionally includes, in part, generating wafer data from the optical source, and generating an optical proximity correction (OPC) model from the wafer data. The optical source may be an extreme ultraviolet optical source.

18 Claims, 10 Drawing Sheets

(56) References Cited

U.S. PATENT DOCUMENTS

2006/0248497 A1* 11/2006 Huang ................ G03F 1/36
716/52
2015/0089459 A1* 3/2015 Liu ................ G06F 30/398
716/53

* cited by examiner

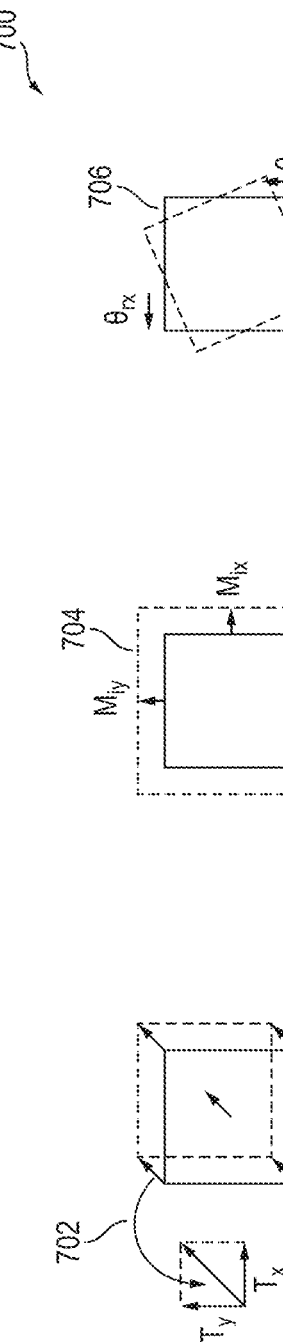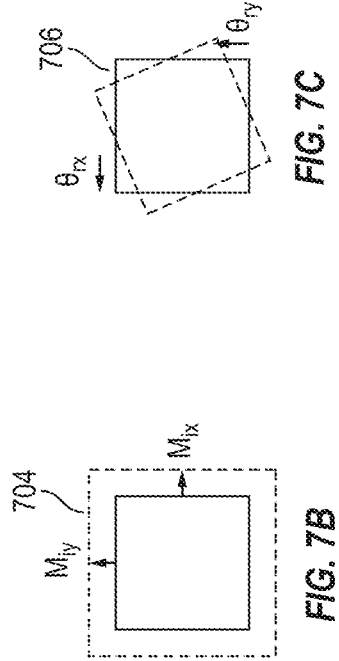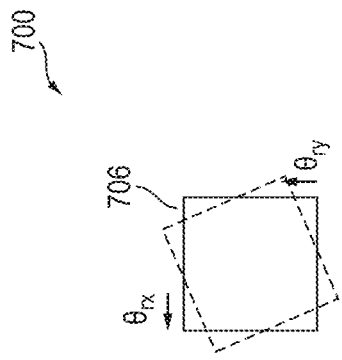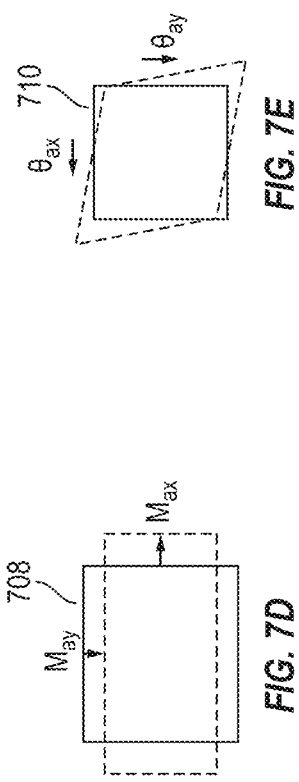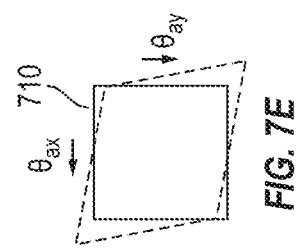
FIG. 7A
FIG. 7B
FIG. 7C
FIG. 7D
FIG. 7E

OPTICAL SOURCE COMPENSATION

CROSS-REFERENCE TO RELATED APPLICATIONS

The present application claims benefit under 35 USC 119 (e) of U.S. Provisional Application Ser. No. 62/456,058, entitled "Source Compensation in EUV," filed Feb. 7, 2017, and U.S. Provisional Application Ser. No. 62/459,782, entitled "Source Compensation in EUV," filed Feb. 16, 2017, the contents of both which are incorporated herein by reference in their entirety.

TECHNICAL FIELD

The present disclosure relates to manufacturing of semiconductor devices, and more particularly to the EUV sources used in manufacturing of an integrated circuit.

BACKGROUND

In the manufacture of an integrated circuit, an illumination source is used during the photolithography process to produce wafer data that is used to create the Optical Proximity Correction (OPC) model, referred to herein as the mask source. The illumination source is used to expose the reticle to print a pattern on the wafer. Accordingly, the mask source including all its defects is stored in the OPC model as well as the reticle.

Over time as the source changes, the mask source become different. Extreme ultraviolet (EUV) sources can degrade as much as 10% per month. These differences or errors mean that the reticle pattern is no longer matched to the source, thereby leading a reduced pattern fidelity and process margin, such as loss in yield and device performance. This changed/degraded source is referred to herein as the exposure source, the source currently used to expose the mask.

There are two conventional methods to resolve source errors, namely building a new reticle or fixing the source. Building a new reticle requires that the user create a new model to fracture the new reticle. Unfortunately, this method is costly and time consuming, e.g. may require at least a week to complete. Furthermore, this solution may not be effective if the source is degraded too far. Moreover, EUV reticles are much more expensive than other reticles such as deep ultraviolet (DUV) reticles.

The second technique for resolving source errors involves a source fix solution. This technique requires the removal of the tool from of the manufacturing and performing costly maintenance thereon that may take several days. Changing an EUV source component may cost more than $1 million. A need continues to exist for an improved compensation of a EUV source.

SUMMARY OF THE INVENTION

A method of compensating for the degradation of an optical source, in accordance with one embodiment of the present invention, includes in part, generating a first model of the optical source at a first point in time, generating a second model of the optical source at a second point in time occurring after the first point in time, determining a difference between the first and second models, and varying a dose of the optical source if the determined difference is greater than a first threshold value.

In one embodiment, the method further includes, in part, varying a focus distance of the optical source if the determined difference is greater than the first threshold value. In one embodiment, the generation of the first model includes, in part, generating wafer data from the optical source, and generating an optical proximity correction (OPC) model from the wafer data. In one embodiment, the method further includes, in part, enhancing the resolution of the OPC model. In one embodiment, the method further includes, in part, phase shifting the OPC model.

In one embodiment, the method further includes, in part, evaluating the OPC model quality using a lithographic rule checker, and performing additional fixes/corrections if the OPC model quality is evaluated to be lower than a threshold value. In one embodiment, the method further includes generating a lithographic mask using the evaluated OPC model. In one embodiment, the optical source is an extreme ultraviolet optical source.

A method of compensating for degradation of an optical source, in accordance with one embodiment of the present invention, includes, in part, generating a first model of the optical source at a first point in time, generating a second model of the optical source at a second point in time occurring after the first point in time, determining the difference between the first and second models, and varying one or more overlay parameters of the optical source if the determined difference is greater than a first threshold value.

In one embodiment, the generation of the first model includes, in part, generating wafer data from the optical source, and generating an optical proximity correction (OPC) model from the wafer data. In one embodiment, the method further includes, in part, evaluating the OPC model quality using a lithographic rule checker, and performing additional fixes/corrections if the OPC model quality is evaluated to be lower than a threshold value. In one embodiment, the method further includes generating a lithographic mask using the evaluated OPC model. In one embodiment, the optical source is an extreme ultraviolet optical source.

A computer system, in accordance with one embodiment of the present invention, is configured to generate a first model of the optical source at a first point in time, generate a second model of the optical source at a second point in time occurring after the first point in time, determine a difference between the first and second models, and vary a dose of the optical source if the determined difference is greater than a first threshold value, thereby to compensate for the degradation of the optical source.

In one embodiment, the computer system is further configured to vary a focus distance of the optical source if the determined difference is greater than the threshold value. In one embodiment, the computer system is further configured to generate wafer data from the optical source, and generate an optical proximity correction (OPC) model from the wafer data, thereby to generate the first model.

In one embodiment, the computer system is further configured to enhance a resolution of the OPC model. In one embodiment, the computer system is further configured to phase shift the OPC model. In one embodiment, the computer system is further configured to evaluate the OPC model quality using a lithographic rule checker, and perform additional fixes/corrections if the OPC model quality is evaluated to be lower than a threshold value. In one embodiment, the computer system is further configured to generate a lithographic mask using the evaluated OPC model. In one embodiment, the optical source is an extreme ultraviolet optical source.

A computer system, in accordance with one embodiment of the present invention, is configured to generate a first model of the optical source at a first point in time, generate a second model of the optical source at a second point in time occurring after the first point in time, determine a difference between the first and second models, and vary one or more overlay parameters a dose of the optical source if the determined difference is greater than a first threshold value, thereby to compensate for the degradation of the optical source.

In one embodiment, the computer system is further configured to generate wafer data from the optical source, and generate an optical proximity correction (OPC) model from the wafer data, thereby to generate the first model. In one embodiment, the computer system is further configured to evaluate the OPC model quality using a lithographic rule checker, and perform additional fixes/corrections if the OPC model quality is evaluated to be lower than a threshold value.

BRIEF DESCRIPTION OF THE DRAWINGS

FIGS. 7A-7E show a number of exemplary mask pattern shifts used to compensate for pattern placement errors on the wafer.

DETAILED DESCRIPTION OF THE INVENTION

The following embodiments are described in detail to enable those skilled in the art to make and use various embodiments of the present invention. It is understood that other embodiments would be evident based on the present disclosure, and that system, process, or changes may be made without departing from the scope of the present invention.

In the following description, a source is understood to include any and all optical elements between the illumination source and the wafer, which is normally the illumination source, collimation, the mirrors, and collector in EUV. Thus, reference to a source may refer to the combination of an illumination source and any projection optics. In some instances, drift in the projection optics may also be compensated for using these methods. The source generates the light that is incident on the mask. The projection optics focus the light from the mask that is reduced in magnification and projected onto the wafer.

Embodiments of the present invention resolve source error(s) that arises when a reticle pattern is no longer matched to the illumination source from which it was derived. Such a mismatch leads, among other things, to pattern fidelity problems and loss in yield and devices performance.

Source error impacts on final wafer critical dimension (CD) can be divided into two categories, namely CD change and pattern shift. CD change is the variation in CD as the source errors occur. The CD changes mostly appear to occur due to changes in the intensity from the source error. Pattern shift is the movement of the center of the printed pattern from the center of the drawn pattern. Pattern shifts appear to be predominantly impacted by the position of the error in the source.

Embodiments of the present invention compensate source degradation in photolithography scanners thereby increasing the usable lifetime of the source and/or mask, by, for example, a factor of 3 or 4. As is known, source degradation occurs in scanners and steppers due to many impacts such as debris, photoresist out gassing, lens heating, and the like. In Deep Ultra Violet (193 nm or DUV) systems the degradation is slow (months and years) and many of the problems associated therewith may be fixed during preventative maintenance. In Extreme Ultra Violet (13.4-13.6 nm or EUV) systems the source degrades noticeably in weeks or months. Small degradations can render OPC corrections on reticles useless, requiring a new reticle. Large degradations require fixes to the source.

Figure 1A:
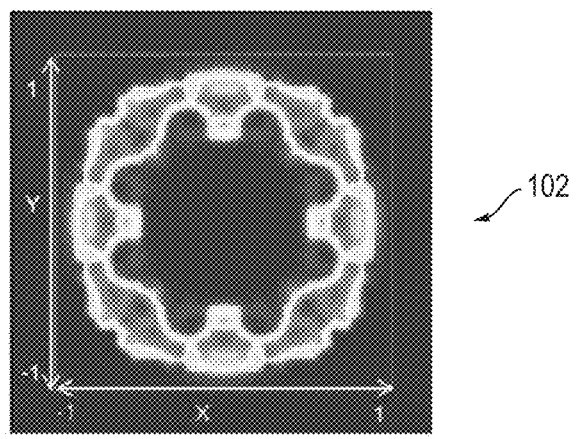
FIG. 1A shows an exemplary initial illumination source image.
Figure 1B:
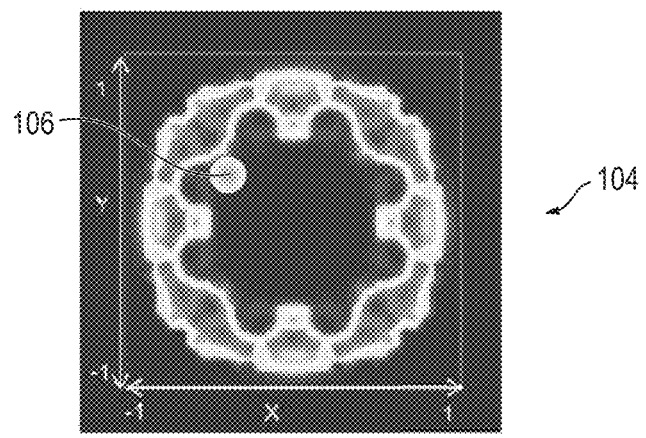
FIG. 1B shows the exemplary image of the illumination source of FIG. 1 after it has been degraded.

FIG. 1A shows an initial source image 102. The mask source is used to generate wafer data that, in turn, is used to create an OPC model which, in turn, is the used to perform an OPC run, the resulting output of which is stored in a gds or oas file, then written to the mask. The initial source including all its defects are therefore stored in the OPC model and hence are stored in the reticle that is subsequently used to print a pattern on the wafer. The initial source used to create the OPC model and the corrected pattern is the mask source. As time passes, the illumination source degrades thereby causing a mismatch to form between the current source and the mask source (i.e., the source when the OPC model was made and OPC generated and written to the reticle). FIG. 1B shows an exemplary image of the initial source 102 after it has been degraded. As is seen, the degradation is the formation of spot 106 in FIG. 1B. These differences, or errors, indicate that the reticle pattern is mismatched to the source which can lead to reduced pattern fidelity and process margin (i.e., loss in yield and device performance.)

Figure 2A:
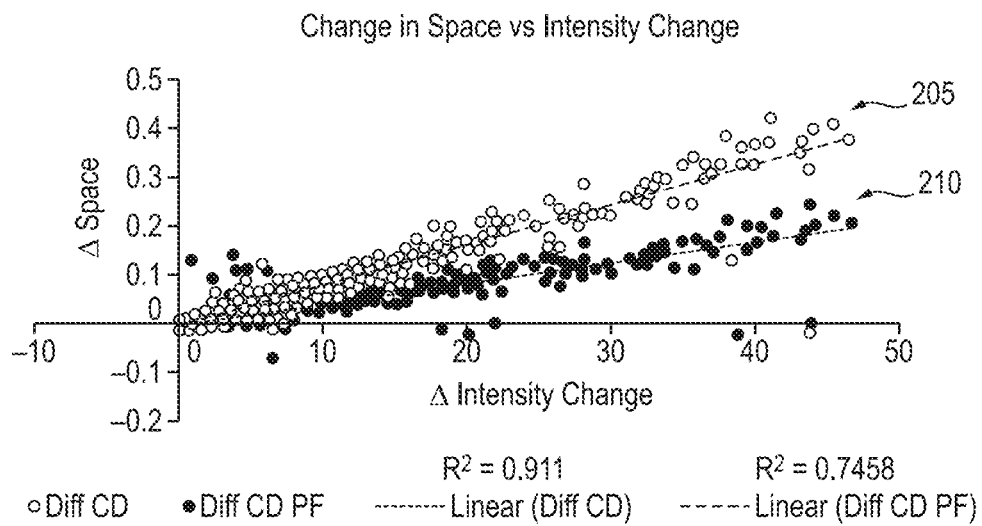
FIG. 2A shows an exemplary impact of an illumination source error on final wafer critical dimensions.

FIG. 2A illustrates an illumination source error impact 200 on final wafer critical dimensions (CD). The CD change is the variation in CD as source errors occur. The CD change may occur due to a change in intensity from the source error. Plot 205 of FIG. 2A shows how CD changes as erroneous intensity is added to the source. The added intensity is about 2% or less of the total illumination intensity. The delta space value is the change in a space CD due to the change in the intensity in nanometers. Data points associated with plot 210 are taken at best focus and data points associated with plot 205 are taken at a positive defocus value.

Figure 2B:
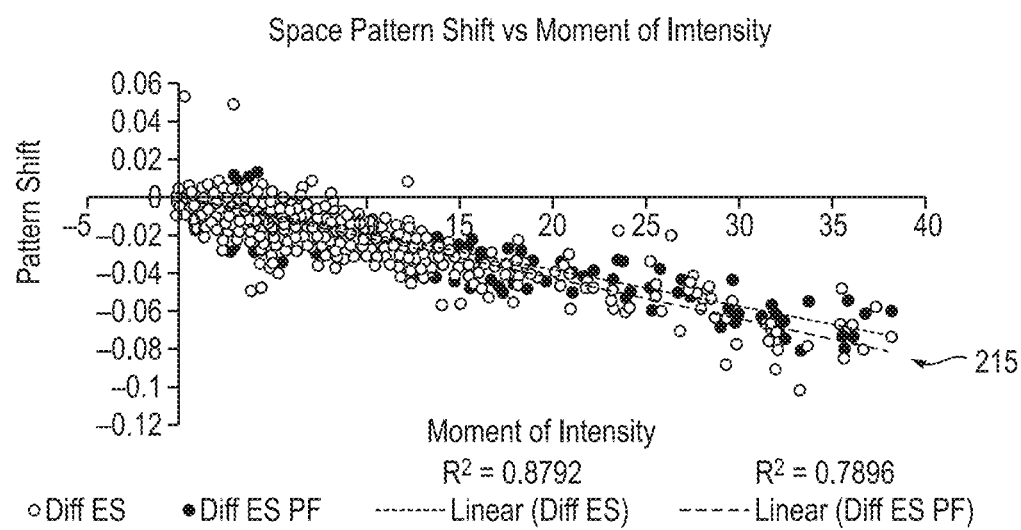
FIG. 2B shows an exemplary pattern shift related to the movement of the center of the printed pattern from the center of the drawn pattern.

FIG. 2B shows the pattern shift 215 related to the movement of the center of the printed pattern from the center of the drawn pattern. Pattern shift 215 appears to be predominantly impacted by the position of the error in the source. Impacts from the source errors on the manufacturing process may be measured and compensated, in accordance with embodiments of the present invention, without incurring the cost to prepare a new reticle or to perform maintenance. The change in pattern placement (pattern shift) for a space feature as a function of the difference of moment intensity. The points in FIG. 2B are keyed the in the manner as shown for FIG. 2A.

Figure 3:
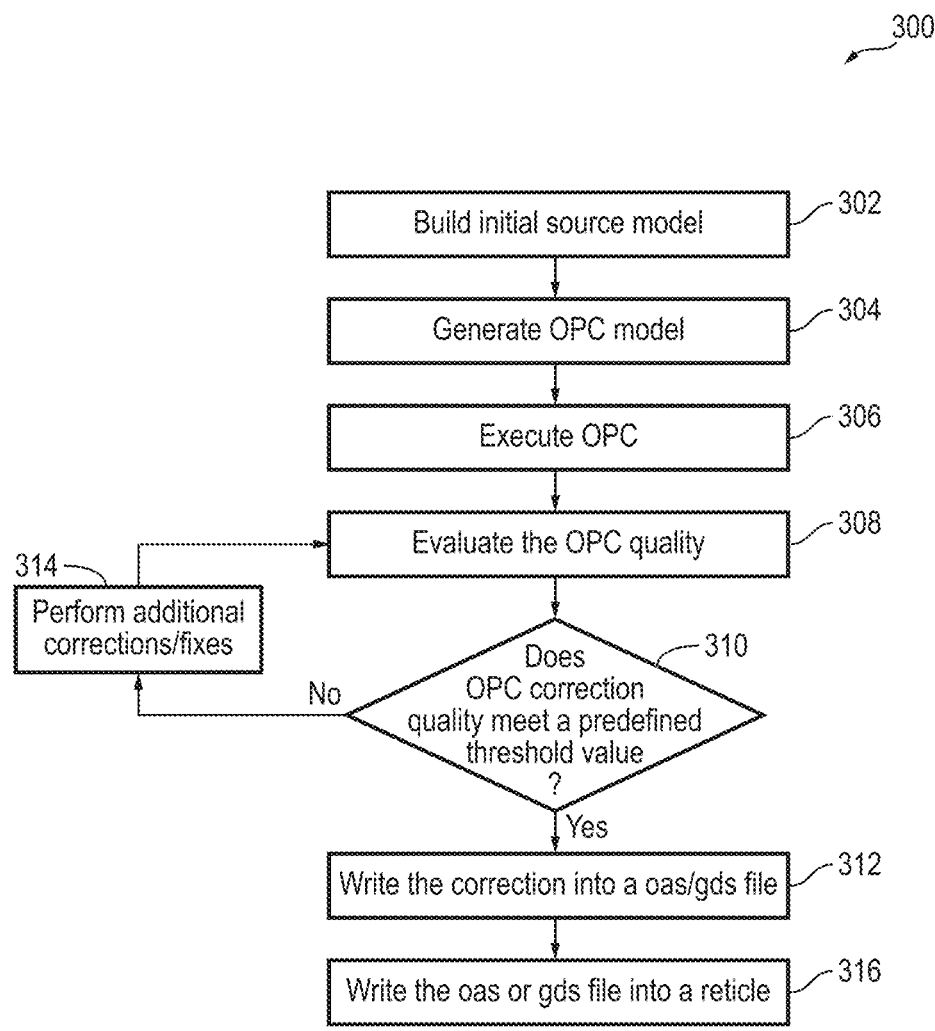
FIG. 3 is a flowchart for generating a mask source, in accordance with one embodiment of the present invention.

FIG. 3 is a flowchart 300 for generating a mask source, in accordance with one embodiment of the present invention. At 302 an initial source model is formed by generating wafer data from the initial source. The data are subsequently used at 304 to generate an OPC model, which has the side effect of storing the mask source in the correction process. At 306 the model is executed to perform OPC. In some embodiment, at 306, additional resolution enhancement and/or phase shifting may also be performed. At 308 the OPC model is evaluated using a lithographic rule checker, such as the Proteus Lithography rule checker (PRLC) commercially available from Synopsys Inc. of Mountain View, Calif., to determine the quality of correction. If at 310 the OPC correction quality as measured by, e.g., the PLRC, meets a predefined threshold, the correction is written to the final oas/gds file at 312. If at 310 the OPC correction quality fails to meet the predefined threshold value, additional fixes in areas such as the model, the correction set, or the design are carried out at 314 and reevaluation is performed at 308. The corrected pattern is subsequently written on a reticle and stored in an .oas or gds file at 312. The oas or gds file is then written on a reticle at 316. Therefore, the reticle, through the model, stores data characteristic of the initial source. The reticle is the used in production, during which the source degrades.

Figure 4:
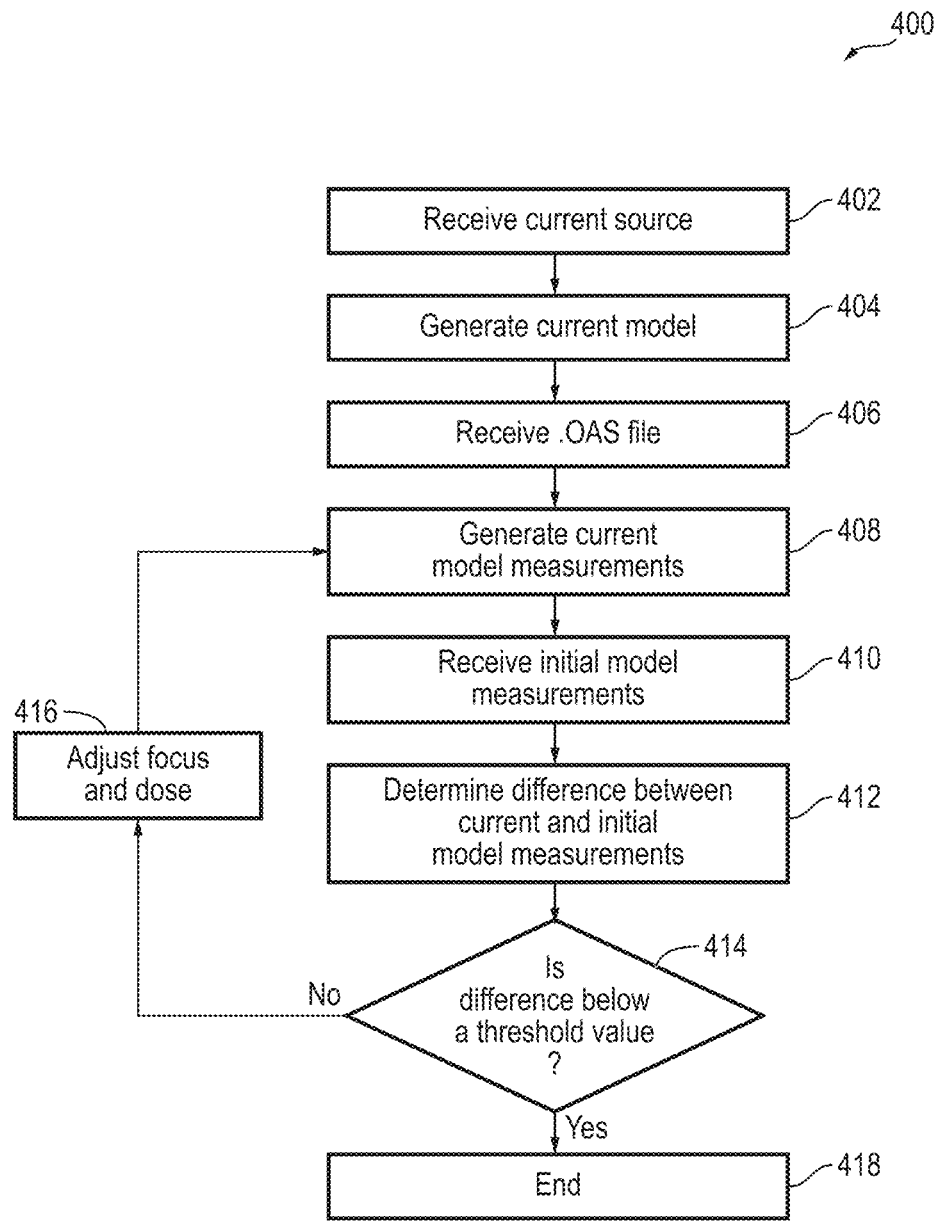
FIG. 4 is a flowchart for compensating a difference between a mask source and a current or exposure source, in accordance with one embodiment of the present invention.

FIG. 4 is a flowchart 400, in accordance with one embodiment of the present invention, for compensating the difference between the mask source (i.e., the mask created with the illumination source as characterized during the initial mask generation and referred to alternatively as the initial model, or the initial model measurements) and the exposure source (i.e., the illumination source, which is also alternatively referred to herein as the current source) due to the degradation of the illumination source over time. To achieve this, the current source measurement data are received at 402. Next, at 404, a model (referred to herein as current source model, exposure model, current source model measurement or current model measurements) is generated for the current source. Thereafter at 406, the mask source corrected .OAS or gds file—generated at 312 of flowchart 300 shown in FIG. 3—is received. The received .OAS file is then evaluated using a lithography rule checker, such as the PLRC, with the exposure source model to generate the current model measurements across the mask pattern at 408.

At 410, the initial model measurement as generated in accordance with flowchart 300 shown in FIG. 3 is received. At 412, the current model measurements are compared to the initial model measurements. If at 414, the difference between the current model measurements and the initial model measurements is determined to be greater than a threshold value, then at 416, either the focus, or dose, or both focus and dose of the scanner associated with the illumination source, is adjusted. The scanner is understood to refer the entire tool and includes components such as the illumination source, the projection optics, the reticle stage, and the wafer stage. The source is understood to refer to the portion of the scanner that gathers input light and conditions it (collimation, filtering, etc.) to illuminate the reticle. The adjustment continues as shown at 408, 410, 412 and 414 until the difference between the current model measurements and the initial model measurements is less than the threshold value. The focus and/or dose determined through this compensation process are applied to the scanner during wafer production using existing reticles. If at 414, the difference between the current model measurements and the initial model measurements is determined to be less than the threshold value, then at 418 the focus and/or dose compensation is terminated.

Figure 5A:
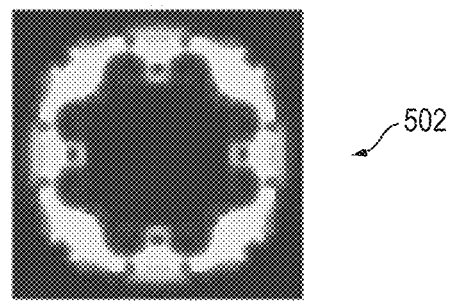
FIG. 5A is an exemplary image associated with an illumination source used to create an initial source model.
Figure 5B:
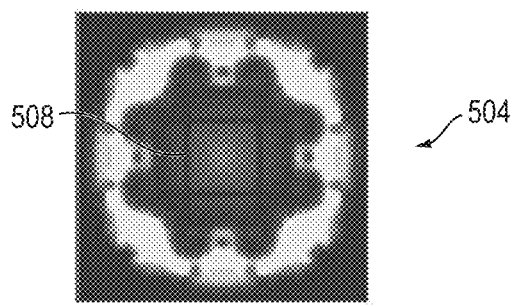
FIG. 5B is an exemplary image associated with an illumination source that has been degraded due to use and aging.

FIG. 5A is an exemplary image 502 associated with an illumination source used to create an initial source model. FIG. 5B is an exemplary image 504 associated with the illumination source that has been in used and thus degraded due to aging. As is seen from FIG. 5B, the aging has caused a relatively large defect 508 to be created near the center of the image. In one example, to compensate for the degraded image defect zone 508, a nearly 7% dose decrease is added to the system.

Figure 6:
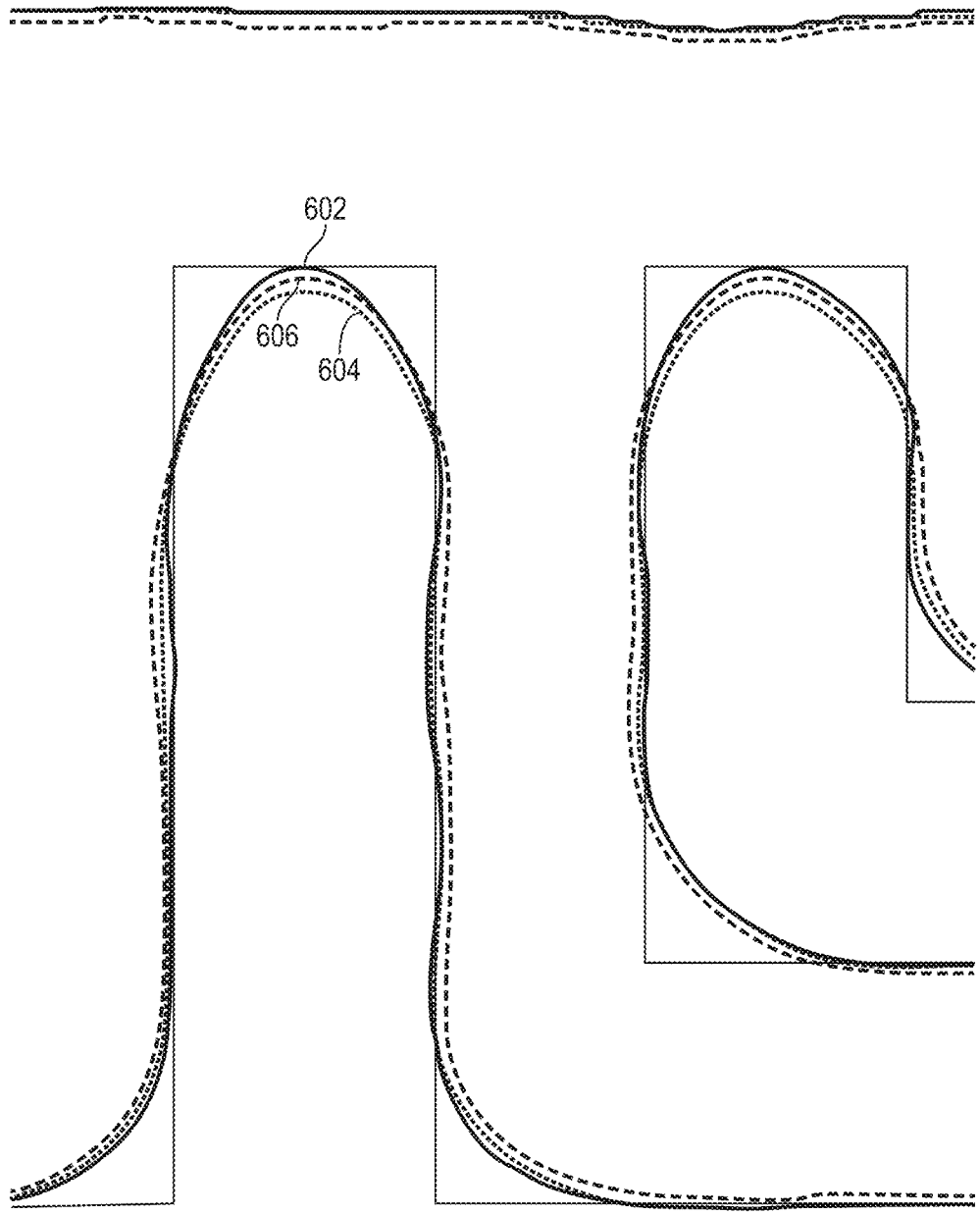
FIG. 6 shows exemplary contours of an initial source line, a current source line and a line compensated in accordance with one embodiment of the present invention.

Referring to FIG. 6, line 602 shows the contours of an initial source, in one example. Line 604 shows the contours of a current source that has degraded over time. Line 606 shows the contours of a dose compensated source. As is seen from FIG. 6, in this example, the dose compensation has caused lines 606 to be closer to line 602. It is understood that other defects may compensated for using other dosage and/or focus variations. Among layers that may be compensated in accordance with embodiment of the present invention, are metals, vias, contacts, and the like.

Embodiments of the present invention are adapted to further compensate for pattern shifts. Pattern shift compensation occurs in most state of the art projection optics systems used in the manufacture of integrated circuits. FIGS. 7A-7E show a number of mask pattern compensation shifts commonly used on scanners and steppers. FIG. 7A shows an intrafield translation 702. FIG. 7B shows an isotropic magnification 704. FIG. 7C shows a reticle rotation 706. FIG. 7D shows an asymmetric magnification 708. FIG. 7E shown an asymmetric rotation. The magnitudes/values of the controls used to compensate for pattern shifts are referred to herein as overlay parameters.

In accordance with another aspect of the present invention, by adjusting the scanner's overlay settings to new values that will reduce pattern placement degradation, the degraded source is enabled to continue to function. Such an adjustment reduces the impact of pattern shift due to source errors. The process for compensating placement error, in accordance with one embodiment of the present invention, is as follows:

1. Generate a test pattern with measurement sites (gauge(i), i=0 to number of gauges-1)
2. Correct the test pattern using a model with the source at time=0 (Model(t=0))
3. Measure the corrected test pattern gauges using Model (t=0) and store the measurement for each gauge.
4. Create a model for the degraded source (Model (t=current)), which is normally weeks or months after the Model(t=0) is created.
5. Iterate over overlay components (see the components below) to reduce the difference between all the gauges(i,t=0) and gauge(i,t=current)
6. Use the overlay settings found in the iterations on the scanner.
7. Repeat as the source continues to degrade.

By increasing usable source and reticle times, embodiments of the present invention compensate for the source pattern placement degradation using Scanner overlay settings without costly downtime for maintenance. Delaying the need to make new reticles or to replace source components in EUV systems, can result in millions of dollars in cost savings by eliminating the need to create a new reticle or replace source components in EUV.

Figure 8:
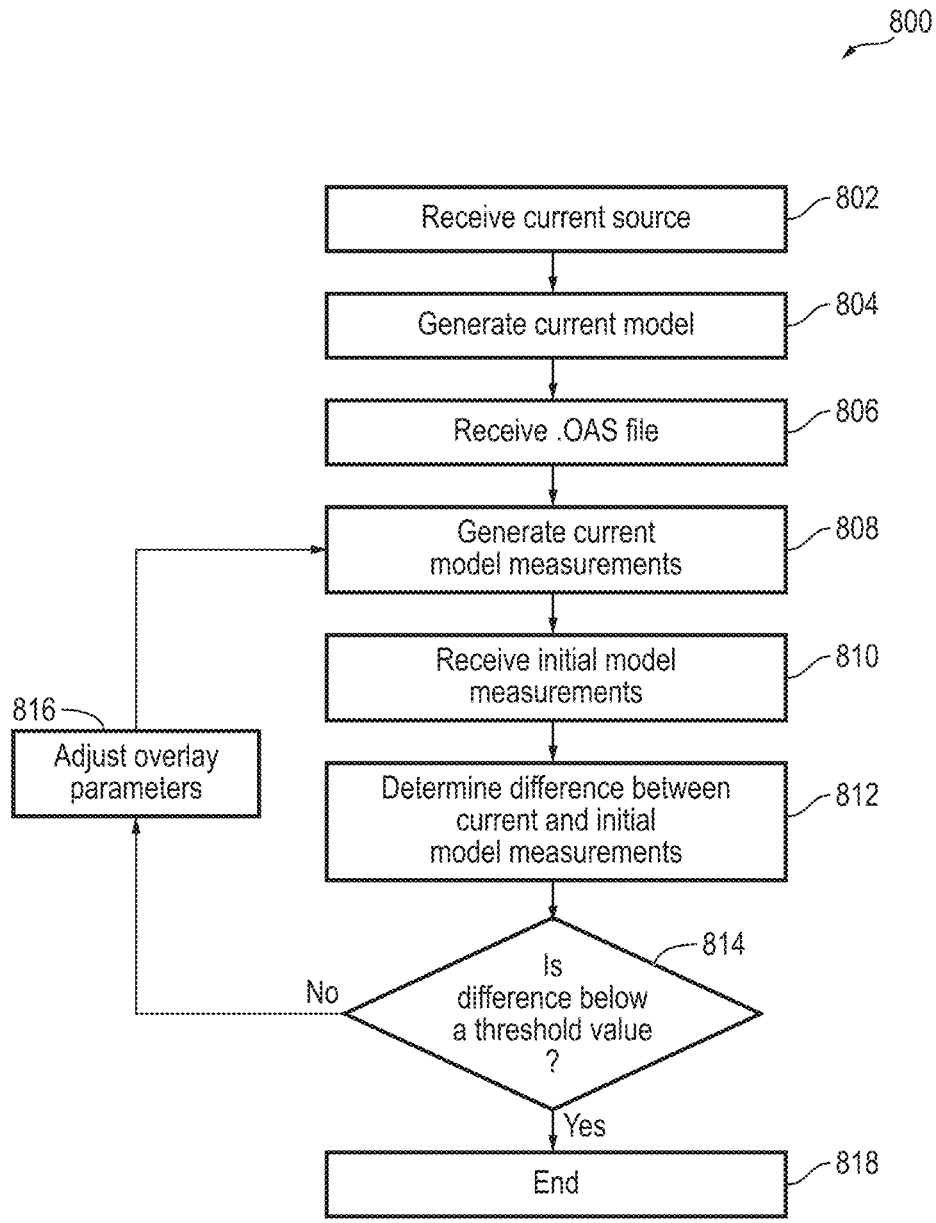
FIG. 8 is a flowchart for compensating placement error in accordance with one embodiment of the present invention.

FIG. 8 is a flowchart 800 for compensating placement error in accordance with one embodiment of the present invention. Placement error may occur as the reticle changes over time. To achieve this, the current source measured data, as shown in flowchart 400, is received at 802. Next, at 804, a current model is generated for the current source. Thereafter at 408, the mask source corrected .OAS file—generated at 312 of flowchart 300 shown in FIG. 3—is received. The received .OAS file is combined with the mask source to generate current model measurements across the mask pattern at 808. In one embodiment, a Proteus Lithography Rule Checker (PLRC) may be utilized to generate the current model measurements at 408.

At 810, the initial model measurement as generated in accordance with flowchart 300 shown in FIG. 3 (308) is received. At 812, the current model measurements are compared to the initial model measurements. If at 814, the difference between the current model measurements and the initial model measurements is determined to be greater than a threshold value, then at 816, one or more of the overlay parameters is adjusted. The adjustment continues as shown at 808, 810, 812 and 814 until the difference between the current model measurements and the initial model measurements is less than the threshold value. The focus and/or dose determined through this compensation process are applied to the scanner during wafer production using existing reticles. If at 814, the difference between the current model measurements and the initial model measurements is determined to be less than the threshold value, then at 818 the focus and/or dose compensation is terminated.

Semiconductor manufacturers often have many scanners. Each scanner has its own lens and source signature resulting from individual defects and aberrations. The reticle stores information from one scanner. Some scanners may not match well with the scanner used to produce the reticle, thereby requiring a special reticle(s) to be constructed for the scanners that don't match.

In accordance with another aspect of the present invention, by treating the model building scanner as the initial source and the unmatched scanner as the current source, i) compensation using the dose and/or focus process is achieved; ii) pattern shift is compensated using the pattern shift process described above with reference to FIG. 8 and iii) the unmatched scanner may be matched to the model building scanner either by compensation using the dose and/or focus process as described above with reference to FIG. 4 or by pattern shift compensation as described above with reference to FIG. 8, or any combination of the above techniques.

This process then reduces the number of reticles necessary for manufacturing. This results in cost savings because fewer reticles need to be made and there is less chance of error as reticles and scanners are less likely to be mismatched.

Figure 9:
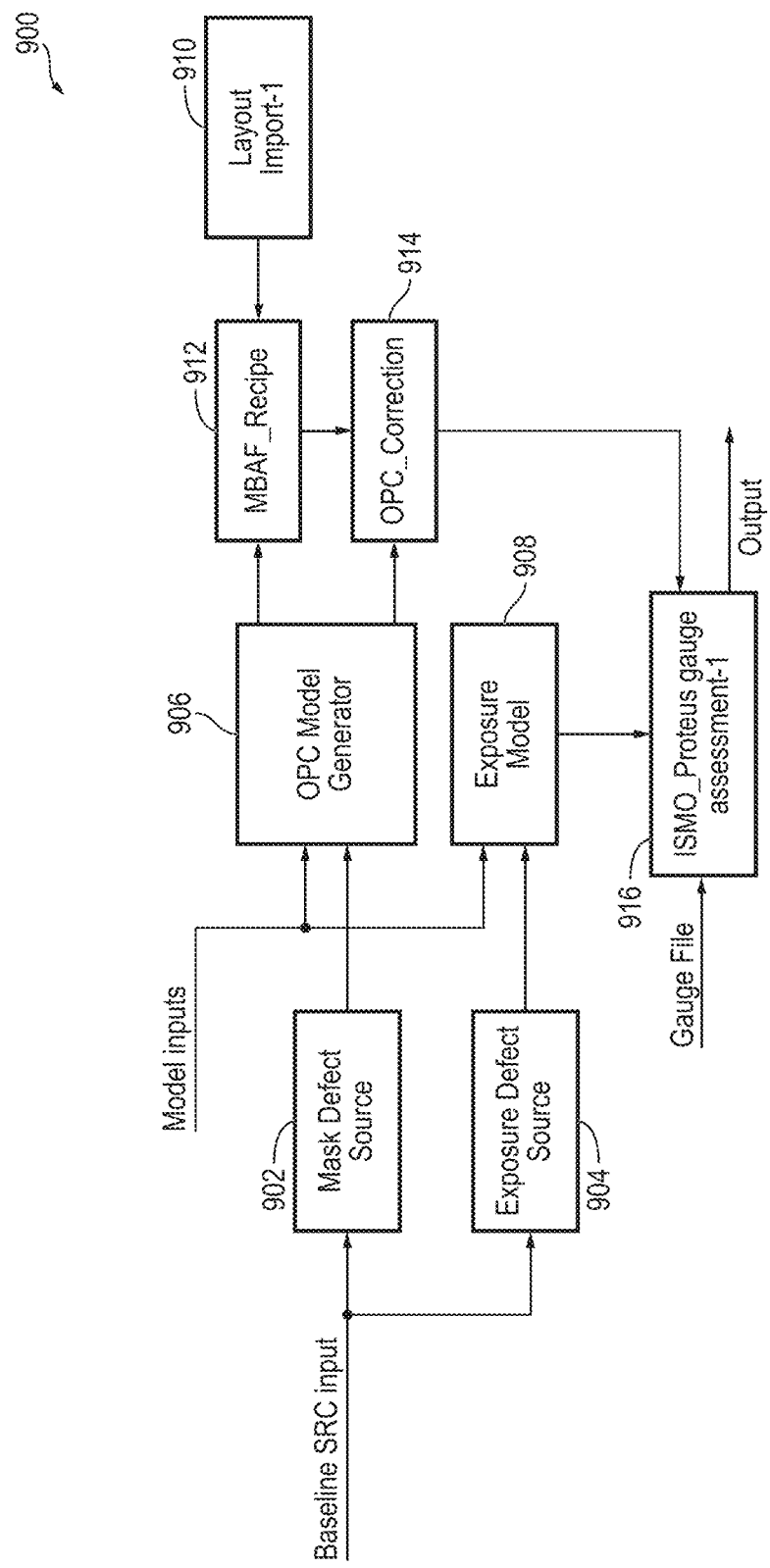
FIG. 9 shows a number of blocks of an EDA tool.

Referring now to FIG. 9, an exemplary EDA tool flow 900 is illustrated that implements the analysis of the illumination source and creates the appropriate models and bias compensation, as described above. The EDA tool flow 900 is shown as including, in part, a mask defect source 902, an exposure defect source 904, an OPC model generator 906, an exposure model 908, a layout import-1 910, an MBAF_Recipe 912, an OPC_Correction 914, and an ISMO_Proteus gauge assessment-1 916. MBAF refers to a Model Based Assist Feature, a tool that can be used to place SRAF (Sub-resolution Assist Features) in a correction. ISMO refers to a Source Mask Optimization tool. The analysis portion of this work may be scripted in the Synopsys workflow tool. The workflow tool iterates over focus, dose, and other parameters.

These processes result in fewer new duplicate reticles being produced and less tool maintenance, which can generate significant cost savings for DUV and EUV through tool matching. The savings are significant for EUV (millions of dollars) by extending viable production time through bias and placement error compensation.

Figure 10:
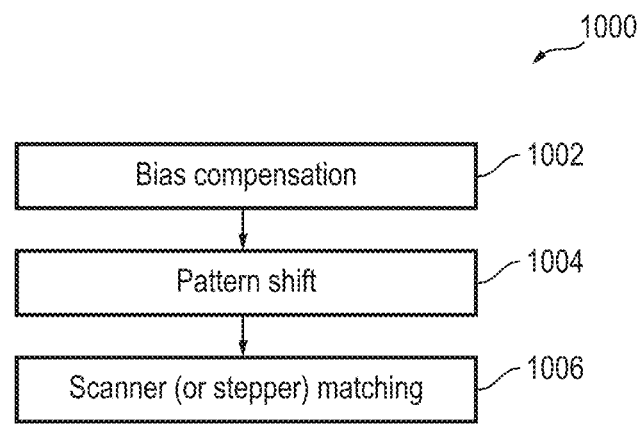
FIG. 10 shows a source error resolution process in accordance with one embodiment of the present invention.

Referring to FIG. 10, a source error resolution process 1000 is shown as including, in part, bias compensation 1002, pattern shifting 1004, and scanner (or stepper) matching 1006.

The main idea is to improve the performance of a reticle across a scanner fleet by finding the optimal focus, dose, and overlay settings for the reticle on each scanner in the fleet. The new settings are determined using iterative solving techniques.

As described above, embodiments of the present invention compensate for the problem of source differences in photolithography scanners. A source is understood to include all components in the optical column including the projection optics. Any two photolithography scanners will have different optics signatures. Such differences can be significant enough that a reticle generated from data on one scanner will have a degraded performance on a different scanner. This is because the model used to generate the OPC correction for the reticle embeds the scanner signature, effectively making the reticle scanner specific. In accordance with embodiments of the present invention, and as described above, source differences in photolithography scanners are minimized by adjusting the scanner's focus, dose, and overlay settings to selected new values to reduce pattern degradation, thereby allowing the reticle to function on a different scanner. This adjustment works to reduce the impact of CD bias and pattern shift due to scanner differences. To achieve this the following are performed:

1. Generate a test pattern with measurement sites (gauge (i), i=0 to number of gauges-1)

2. Correct the test pattern using a model with the source for scanner=0 (Model(s=0))

3. Measure the corrected test pattern gauges using Model (s=0) and store the measurement for each gauge.

4. Create a model for the new scanner n (Model(s=n)).

5. Iterate over overlay components (see the components below), focus, and dose to reduce the difference between all the gauge(i,s=0) and gauge(i, s=n)

6. Use the focus, dose, and overlay settings found in the iterations on the scanner.

7. Repeat for each scanner on which the reticle can be used.

With the above flow, in accordance with one aspect of the present invention, the performance of a reticle is improved across one or more scanners by adjusting focus, dose, overlay settings, or any combinations thereof, for the reticle on the scanner. The new settings are determined using the iterative process described above to eliminate the need to make scanner specific reticles. The above process also improves reticle performance for any scanner.

Figure 11:
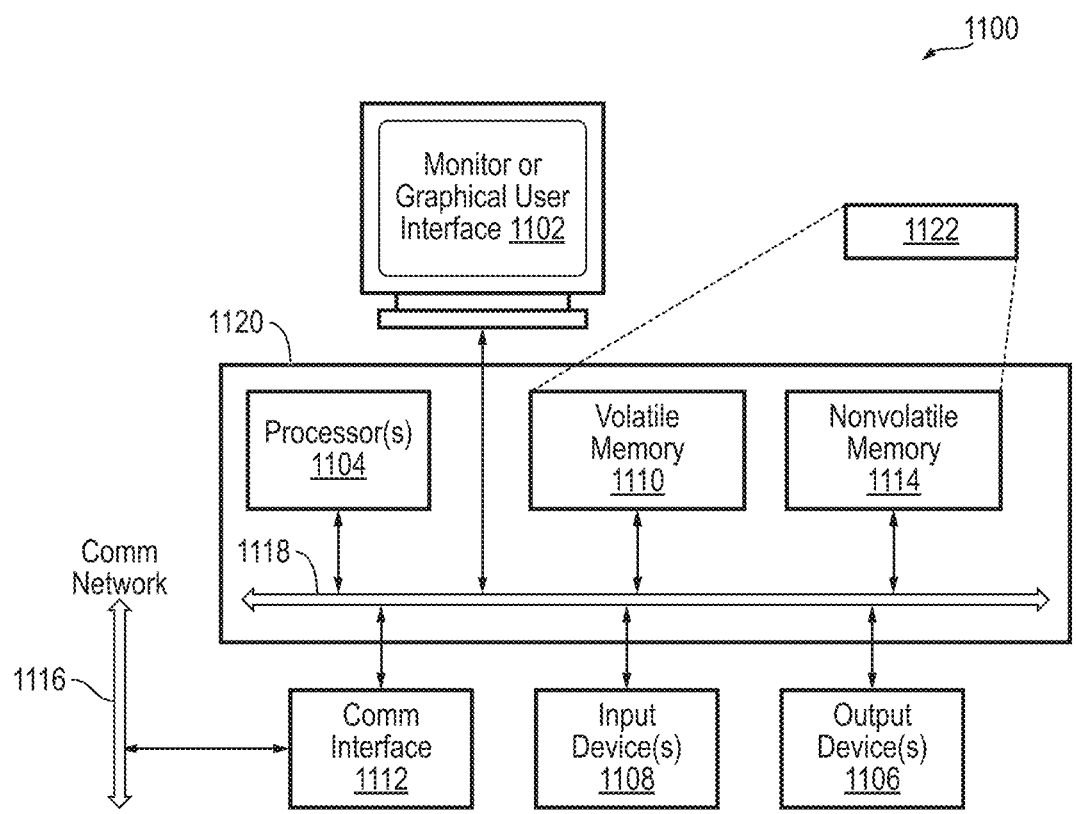
FIG. 11 is an exemplary block diagram of a computing device that may incorporate embodiments of the present invention.

FIG. 11 is an exemplary block diagram of a computing device 1100 that may incorporate embodiments of the present invention. FIG. 11 is merely illustrative of a machine system to carry out aspects of the technical processes described herein, and does not limit the scope of the claims. One of ordinary skill in the art would recognize other variations, modifications, and alternatives. In one embodiment, the computing device 1100 typically includes a monitor or graphical user interface 1102, a data processing system 1120, a communication network interface 1112, input device(s) 1108, output device(s) 1106, and the like.

As depicted in FIG. 11, the data processing system 1120 may include one or more processor(s) 1104 that communicate with a number of peripheral devices via a bus subsystem 1118. These peripheral devices may include input device(s) 1108, output device(s) 1106, communication network interface 1112, and a storage subsystem, such as a volatile memory 1110 and a nonvolatile memory 1114.

The volatile memory 1110 and/or the nonvolatile memory 1114 may store computer-executable instructions and thus forming logic 1122 that when applied to and executed by the processor(s) 1104 implement embodiments of the processes disclosed herein.

The input device(s) 1108 include devices and mechanisms for inputting information to the data processing system 1120. These may include a keyboard, a keypad, a touch screen incorporated into the monitor or graphical user interface 1102, audio input devices such as voice recognition systems, microphones, and other types of input devices. In various embodiments, the input device(s) 1108 may be embodied as a computer mouse, a trackball, a track pad, a joystick, wireless remote, drawing tablet, voice command system, eye tracking system, and the like. The input device(s) 1108 typically allow a user to select objects, icons, control areas, text and the like that appear on the monitor or graphical user interface 1102 via a command such as a click of a button or the like.

The output device(s) 1106 include devices and mechanisms for outputting information from the data processing system 1120. These may include speakers, printers, infrared LEDs, and so on as well understood in the art.

The communication network interface 1112 provides an interface to communication networks (e.g., communication network 1116) and devices external to the data processing system 1120. The communication network interface 1112 may serve as an interface for receiving data from and transmitting data to other systems. Embodiments of the communication network interface 1112 may include an Ethernet interface, a modem (telephone, satellite, cable, ISDN), (asynchronous) digital subscriber line (DSL), FireWire, USB, a wireless communication interface such as BlueTooth or WiFi, a near field communication wireless interface, a cellular interface, and the like.

The communication network interface 1112 may be coupled to the communication network 1116 via an antenna, a cable, or the like. In some embodiments, the communication network interface 1112 may be physically integrated on a circuit board of the data processing system 1120, or in some cases may be implemented in software or firmware, such as "soft modems", or the like.

The computing device 1100 may include logic that enables communications over a network using protocols such as HTTP, TCP/IP, RTP/RTSP, IPX, UDP and the like.

The volatile memory 1110 and the nonvolatile memory 1114 are examples of tangible media configured to store computer readable data and instructions to implement various embodiments of the processes described herein. Other types of tangible media include removable memory (e.g., pluggable USB memory devices, mobile device SIM cards), optical storage media such as CD-ROMS, DVDs, semiconductor memories such as flash memories, non-transitory read-only-memories (ROMS), battery-backed volatile memories, networked storage devices, and the like. The volatile memory 1110 and the nonvolatile memory 1114 may be configured to store the basic programming and data constructs that provide the functionality of the disclosed processes and other embodiments thereof that fall within the scope of the present invention.

Software that implements embodiments of the present invention may be stored in the volatile memory 1110 and/or the nonvolatile memory 1114. Said software may be read from the volatile memory 1110 and/or nonvolatile memory 1114 and executed by the processor(s) 1104. The volatile memory 1110 and the nonvolatile memory 1114 may also provide a repository for storing data used by the software.

The volatile memory 1110 and the nonvolatile memory 1114 may include a number of memories including a main random access memory (RAM) for storage of instructions and data during program execution and a read only memory (ROM) in which read-only non-transitory instructions are stored. The volatile memory 1110 and the nonvolatile memory 1114 may include a file storage subsystem providing persistent (non-volatile) storage for program and data files. The volatile memory 1110 and the nonvolatile memory 1114 may include removable storage systems, such as removable flash memory.

The bus subsystem 1118 provides a mechanism for enabling the various components and subsystems of data processing system 1120 communicate with each other as intended. Although the communication network interface 1112 is depicted schematically as a single bus, some embodiments of the bus subsystem 1118 may utilize multiple distinct busses.

It will be readily apparent to one of ordinary skill in the art that the computing device 1100 may be a mobile device such as a smartphone, a desktop computer, a laptop computer, a rack-mounted computer system, a computer server, or a tablet computer device. As commonly known in the art, the computing device 1100 may be implemented as a collection of multiple networked computing devices. Further, the computing device 1100 will typically include operating system logic (not illustrated) the types and nature of which are well known in the art.

Those having skill in the art will appreciate that there are various logic implementations by which processes and/or systems described herein can be effected (e.g., hardware, software, or firmware), and that the preferred vehicle will vary with the context in which the processes are deployed. If an implementer determines that speed and accuracy are paramount, the implementer may opt for a hardware or firmware implementation; alternatively, if flexibility is paramount, the implementer may opt for a solely software implementation; or, yet again alternatively, the implementer may opt for some combination of hardware, software, or firmware. Hence, there are numerous possible implementations by which the processes described herein may be effected, none of which is inherently superior to the other in that any vehicle to be utilized is a choice dependent upon the context in which the implementation will be deployed and the specific concerns (e.g., speed, flexibility, or predictability) of the implementer, any of which may vary. Those skilled in the art will recognize that optical aspects of implementations may involve optically-oriented hardware, software, and or firmware.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more computing devices. The particular distribution and choice of logic will vary according to implementation.

The foregoing detailed description has set forth various embodiments of the devices or processes via the use of block diagrams, flowcharts, or examples. Insofar as such block diagrams, flowcharts, or examples contain one or more functions or operations, it will be understood as notorious by those within the art that each function or operation within such block diagrams, flowcharts, or examples can be implemented, individually or collectively, by a wide range of hardware, software, firmware, or virtually any combination thereof. Portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more processing devices (e.g., as one or more programs running on one or more computer systems), as one or more programs running on one or more processors (e.g., as one or more programs running on one or more microprocessors), as firmware, or as virtually any combination thereof, and that designing the circuitry or writing the code for the software or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, flash drives, SD cards, solid state fixed or removable storage, and computer memory.

In a general sense, those skilled in the art will recognize that the various aspects described herein which can be implemented, individually or collectively, by a wide range of hardware, software, firmware, or any combination thereof can be viewed as being composed of various types of circuitry.

Those skilled in the art will recognize that it is common within the art to describe devices or processes in the fashion set forth herein, and thereafter use standard engineering practices to integrate such described devices or processes into larger systems. At least a portion of the devices or processes described herein can be integrated into a network processing system via a reasonable amount of experimentation. Various embodiments are described herein and presented by way of example and not limitation.

The above embodiments of the present invention are illustrative and not limitative. Embodiments of the present invention are not limited by the type of deposition, patterning, etching, and other semiconductor processing steps required to form the various layers and structures described herein. Embodiments of the present invention are not limited to any specific thicknesses of the layers described herein. Embodiments of the present invention are not limited to the materials/layers described above. Accordingly, it is understood that other semiconductor materials may be present between the various layers described above.

What is claimed is:

1. A method of compensating for degradation of an optical source used to manufacture a semiconductor integrated circuit, the method comprising:
    generating a first model of the optical source at a first point in time,
    wherein generation of the first model comprises:
    generating wafer data from the optical source;
    generating an optical proximity correction (OPC) model from the wafer data, the OPC model being the first model;
    generating a second model of the optical source at a second point in time, said second point in time occurring after the first point in time, the second model being an OPC model generated from wafer data generated at the second point in time;
    determining a difference between the first and second models; and
    varying a dose of the optical source if the determined difference is greater than a second threshold value.

2. The method of claim 1, further comprising:
    varying a focus distance of the optical source if the determined difference is greater than the second threshold value.

3. The method of claim 1, further comprising:
    enhancing a resolution of the OPC model.

4. The method of claim 3, further comprising:
    phase shifting the OPC model.

5. The method of claim 1, further comprising:
    evaluating the OPC model quality using a lithographic rule checker; and
    updating the OPC model if the OPC model quality is evaluated to be lower than a second threshold value.

6. The method of claim 5 further comprising:
    generating a lithographic mask using the evaluated OPC model.

7. The method of claim 6, wherein said optical source is an extreme ultraviolet optical source.

8. A method of compensating for degradation of an optical source, the method comprising:
    generating a first model of the optical source at a first point in time, wherein generation of the first model comprises:
    generating wafer data from the optical source;
    generating an optical proximity correction (OPC) model from the wafer data, the OPC model being the first model;
    generating a second model of the optical source at a second point in time, said second point in time occurring after the first point in time, the second model being an OPC model generated from wafer data generated at the second point in time;
    determining a difference between the first and second models; and
    varying one or more overlay parameters of the optical source if the determined difference is greater than a second threshold value.

9. The method of claim 8, further comprising:
    evaluating the OPC model quality using a lithographic rule checker; and updating the OPC model if the OPC model quality is evaluated to be lower than a second threshold value.

10. A computer system configured to control a manufacture of a semiconductor integrated circuit, the computer system further configured to:
generate a first model of the optical source at a first point in time, wherein the computer is further configured to, in the generation of the first model:
generate wafer data from the optical source;
generate an optical proximity correction (OPC) model from the wafer data, the OPC model being the first model;
generate a second model of the optical source at a second point in time, said second point in time occurring after the first point in time, the second model being an OPC model generated from wafer data generated at the second point in time;
determine a difference between the first and second models; and
vary a dose of the optical source if the determined difference is greater than a second threshold value, thereby to compensate for the degradation of the optical source.

11. The computer system of claim 10, wherein the computer system is further configured to:
vary a focus distance of the optical source if the determined difference is greater than the second threshold value.

12. The computer system of claim 10, wherein the computer system is further configured to:
enhance a resolution of the OPC model.

13. The computer system of claim 10, wherein the computer system is further configured to:
phase shift the OPC model.

14. The computer system of claim 10, wherein the computer system is further configured to:
evaluate the OPC model quality using a lithographic rule checker; and
update the OPC model if the OPC model quality is evaluated to be lower than a second threshold value.

15. The computer system of claim 10, wherein the computer system is further configured to:
generate a lithographic mask using the evaluated OPC model.

16. The computer system of claim 15, wherein the optical source is an extreme ultraviolet optical source.

17. A computer system configured to:
generate a first model of the optical source at a first point in time,
wherein the computer is further configured to, in the generation of the first model:
generate wafer data from the optical source;
generate an optical proximity correction (OPC) model from the wafer data, the OPC model being the first model;
generate a second model of the optical source at a second point in time, said second point in time occurring after the first point in time, the second model being an OPC model generated from wafer data generated at the second point in time;
determine a difference between the first and second models; and
vary one or more overlay parameters a dose of the optical source if the determined difference is greater than a second threshold value, thereby to compensate for the degradation of the optical source.

18. The computer system of claim 17, wherein the computer system is further configured to:
evaluate the OPC model quality using a lithographic rule checker; and
update the OPC model if the OPC model quality is evaluated to be lower than a second threshold value.

* * * * *